US009003121B2

(12) United States Patent
Wang et al.

(10) Patent No.: US 9,003,121 B2
(45) Date of Patent: Apr. 7, 2015

(54) MULTI-PORTED MEMORY WITH MULTIPLE ACCESS SUPPORT

(71) Applicant: Broadcom Corporation, Irvine, CA (US)

(72) Inventors: Weihuang Wang, Los Gatos, CA (US); Chien-Hsien Wu, Cupertino, CA (US)

(73) Assignee: Broadcom Corporation, Irvine, CA (US)

( * ) Notice: Subject to any disclaimer, the term of this patent is extended or adjusted under 35 U.S.C. 154(b) by 178 days.

(21) Appl. No.: 13/655,723

(22) Filed: Oct. 19, 2012

(65) Prior Publication Data
US 2014/0052913 A1 Feb. 20, 2014

Related U.S. Application Data

(60) Provisional application No. 61/683,934, filed on Aug. 16, 2012.

(51) Int. Cl.
G06F 12/00 (2006.01)
G06F 12/08 (2006.01)
G11C 7/10 (2006.01)

(52) U.S. Cl.
CPC .......... *G06F 12/0853* (2013.01); *G11C 7/1075* (2013.01); *G11C 2207/2245* (2013.01); *Y02B 60/1225* (2013.01)

(58) Field of Classification Search
None
See application file for complete search history.

(56) References Cited

U.S. PATENT DOCUMENTS

2006/0075184 A1*  4/2006  Chen ............................ 711/104
2008/0259694 A1* 10/2008  Atwood et al. .......... 365/189.05
2011/0310691 A1* 12/2011  Zhou et al. ............... 365/230.03

* cited by examiner

*Primary Examiner* — Midys Rojas
(74) *Attorney, Agent, or Firm* — Fiala & Weaver P.L.L.C.

(57) ABSTRACT

A multi-ported memory that supports multiple read and write accesses is described herein. The multi-ported memory may include a number of read/write ports that is greater than the number of read/write ports of each memory bank of the multi-ported memory. The multi-ported memory allows for at least one read operation and at least one write operation to be received during the same clock cycle. In the event that an incoming write operation is blocked by the at least one read operation, data for that incoming write operation may be stored in a cache included in the multi-port memory. That cache is accessible to both write operations and read operations. In the event than the incoming write operation is not blocked by the at least one read operation, data for that incoming write operation is stored in the memory bank targeted by that incoming write operation.

20 Claims, 9 Drawing Sheets

MULTI-PORTED MEMORY WITH MULTIPLE ACCESS SUPPORT

CROSS REFERENCE TO RELATED APPLICATION

This application claims priority to U.S. Provisional Application Ser. No. 61/683,934, filed Aug. 16, 2012, the entirety of which is incorporated by reference herein.

BACKGROUND

1. Technical Field

The subject matter described herein relates to memory devices. In particular, the subject matter described herein relates to static random-access memory (SRAM) devices.

2. Description of Related Art

High bandwidth, on-chip memory is required for a wide range of applications, including but not limited to multi-core processors, parallel computing systems, or the like. It would be beneficial if a high bandwidth, on-chip memory could be designed that could concurrently handle two read and two write accesses with low latency.

Single-port (SP) SRAM memory, which supports either one read or one write each clock cycle, is widely used for on-chip memory. Such memory can be extended to support two simultaneous read or write operations by running the internal memory core at twice the clock frequency, herein referred to as pseudo-dual-port (PD) memory. True dual-port memory can be designed to support two read or write operations as well, with less memory density and typically custom design.

4-port register files (RF) exist in the art. Such 4-port RF allows simultaneously two read and two write operations. They are typically custom designed and available only at a small number of bits and are three times worse in area density as compared with single-port (SP) SRAM in a 40 nanometer (nm) General Purpose (40G) manufacturing process.

Dual-pumped dual-port (DDP) memory is another type of customized design currently being used. DDP memory uses internally a dual-port memory, which allows two simultaneous read or write operations, and runs internal memory at twice the clock frequency to allow for four simultaneous read or write operations. DDP memory consumes 70% more area and power as compared with SP and PD memory in a 40G manufacturing process.

BRIEF DESCRIPTION OF THE DRAWINGS/FIGURES

The accompanying drawings, which are incorporated herein and form part of the specification, illustrate the subject matter of the present application and, together with the description, further serve to explain the principles of the embodiment described herein and to enable a person skilled in the relevant art(s) to make and use such embodiments.

Figure 9A:
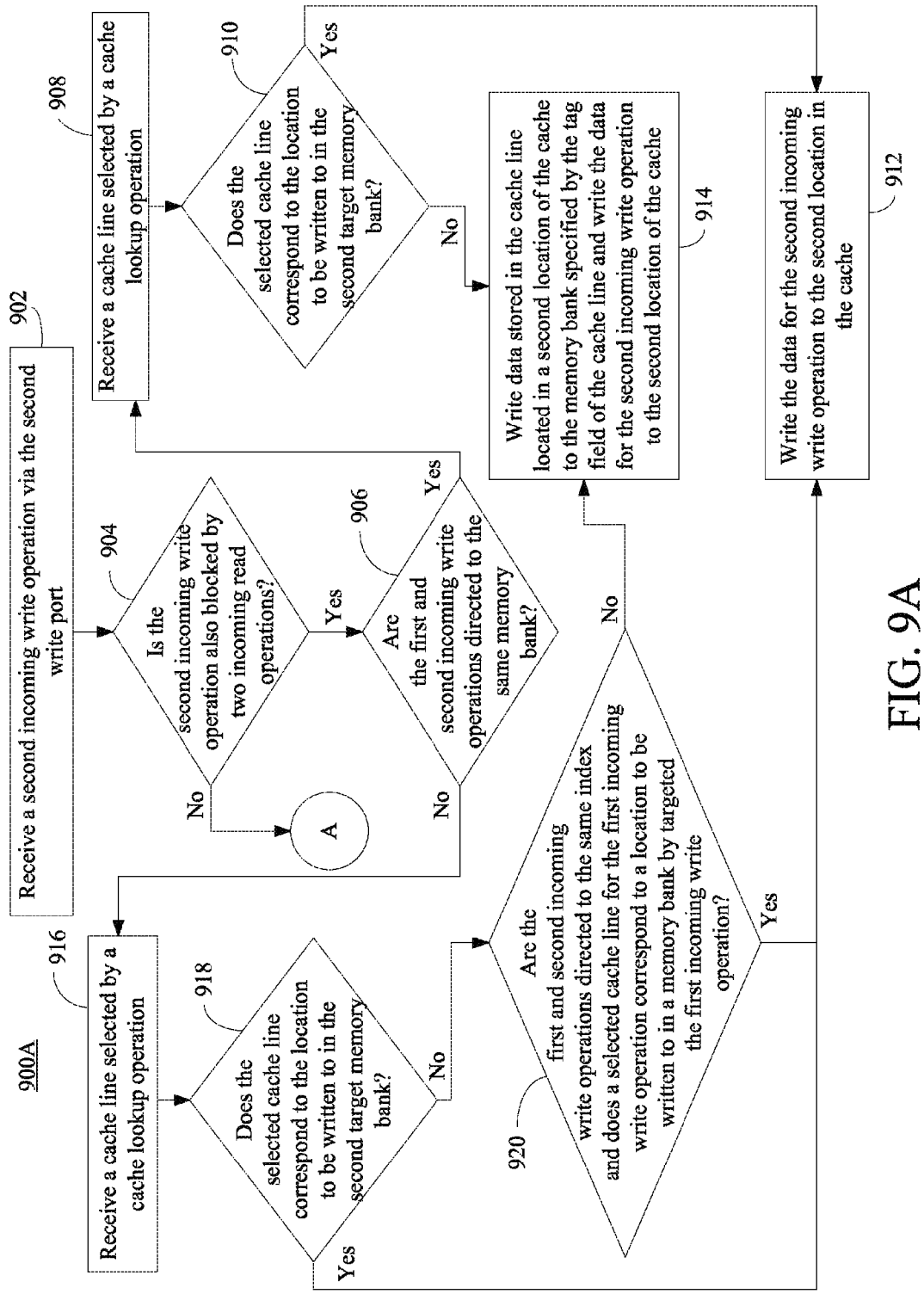
Figure 9B:
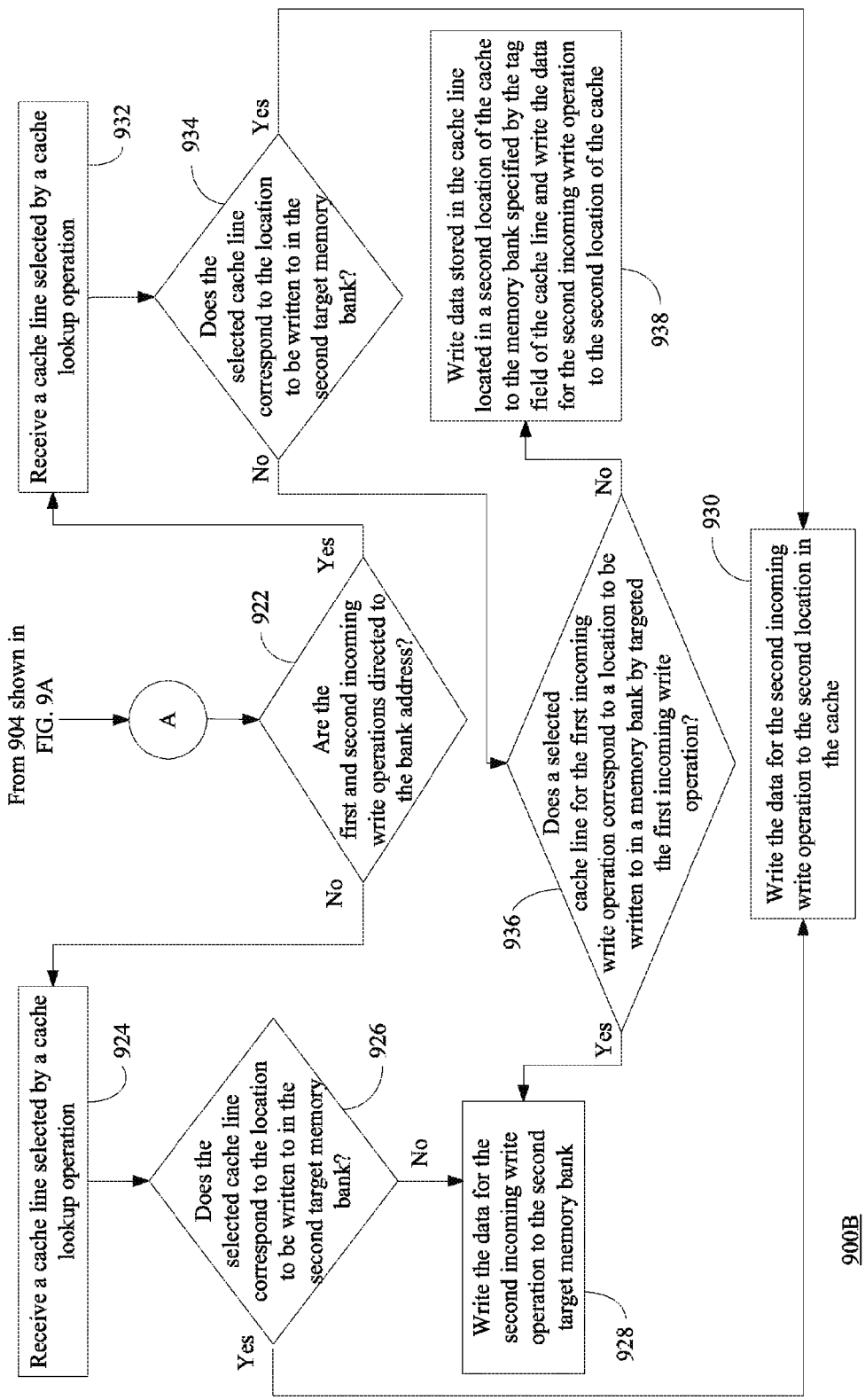

FIGS. 9A-9B depict flowcharts that collectively represent an example method performed by write logic in a memory in accordance with an embodiment when a second incoming write operation configured to write data to a second target memory bank is received via a second write port and a first incoming write operation configured to write data to a first target memory bank is received via a first write port during the same clock cycle.

The features and advantages of the subject matter of the present application will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

I. Introduction

The following detailed description discloses numerous example embodiments.

The scope of the present patent application is not limited to the disclosed embodiments, but also encompasses combinations of the disclosed embodiments, as well as modifications to the disclosed embodiments.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Furthermore, it should be understood that spatial descriptions (e.g., "above," "below," "up," "left," "right," "down," "top," "bottom," "vertical," "horizontal," etc.) used herein are for purposes of illustration only, and that practical implementations of the structures described herein can be spatially arranged in any orientation or manner.

A multi-ported memory that supports multiple read and write accesses is described herein. The multi-ported memory may include a number of read/write ports that is greater than the number of read/write ports of each memory bank of the multi-ported memory. The multi-ported memory allows for at least one read operation and at least one write operation to be received during the same clock cycle. In the event that an incoming write operation is blocked by the at least one read operation, data for that incoming write operation may be stored in a cache included in the multi-port memory. That cache is accessible to both write operations and read operations. In the event than the incoming write operation is not blocked by the at least one read operation, data for that incoming write operation is stored in the memory bank targeted by that incoming write operation.

In the embodiment provided below, the multi-ported memory is a quad-access cached dual-port (QCDP) memory that realizes quad-port access (two read operations and two write operations received during the same clock cycle) at high speed, with dual-ported memory banks. The QCDP memory consumes significantly less power and area as compared to custom-built DDP memory in a 40G manufacturing process, especially with larger memory configurations.

It is noted that the techniques used to achieve the QCDP memory could conceivably be applied to other memories that allow more same-cycle accesses than would otherwise be allowed by the memory banks included therein (e.g., a two-access single port memory that realizes two-port access (a single read operation and a single write operation received during the same clock cycle) at high speed using single-ported memory banks, an eight-access four-port memory that realizes eight-port access (four read operations and four write operations received during the same clock cycle) at high speed using four-ported memory banks, etc.).

In particular, a memory device is described herein. The memory device includes one or more memory banks, at least one cache coupled to each of the one or more memory banks, and control logic coupled to each of the one or more memory banks and to the at least one cache. The control logic is configured to determine whether a first incoming write operation configured to write data to a first target memory bank among the one or more memory banks is blocked by at least one incoming read operation configured to read data from a second target memory bank among the one or more memory banks. The control logic is also configured to write the data associated with the first incoming write operation to the first target memory bank in response to determining that the first incoming write operation is not blocked by the at least one incoming read operation, and write the data associated with the first incoming write operation to a first location in the at least one cache in response to determining that the first incoming write operation is blocked by the at least one incoming read operation.

A method is also described herein. In accordance with the method, a determination is made whether a first incoming write operation configured to write data to a first target memory bank among one or more memory banks is blocked by at least one incoming read operation configured to read data from a second target memory bank among the one or more memory banks. In response to determining that the first incoming write operation is not blocked by the at least one incoming read operation, the data associated with the first incoming write operation is written to the first target memory bank. In response to determining that the first incoming write operation is blocked by the at least one incoming read operation, the data associated with the first incoming write operation is written to a first location in at least one cache.

An apparatus is further described herein. The apparatus includes control logic coupled to each of one or more memory banks and at least one cache. The control logic is configured to determine whether a first incoming write operation configured to write data to a first target memory bank among the one or more memory banks is blocked by at least one incoming read operation configured to read data from a second target memory bank among the one or more memory banks. The control logic is also configured to write the data associated with the first incoming write operation to the first target memory bank in response to determining that the first incoming write operation is not blocked by the at least one incoming read operation, and write the data associated with the first incoming write operation to a first location in the at least one cache in response to determining that the first incoming write operation is blocked by the at least one incoming read operation.

II. Quad-Access Cached Dual-Port (QCDP) Memory

A quad-access cached dual-port (QCDP) memory is described herein that realizes quad-port access at high speed, with dual-ported memory banks. The QCDP allows for two read operations and two write operations to be received during the same clock cycle. In the event that an incoming write operation is blocked by at least one of the two incoming read operations or another incoming write operation, data for the incoming write operation may be stored in a cache included in the QCDP memory. The cache is accessible to both write operations and read operations. The QCDP memory consumes significantly less power and area as compared to custom-built DDP memory in a 40G manufacturing process, especially with larger memory configurations.

Figure 1:
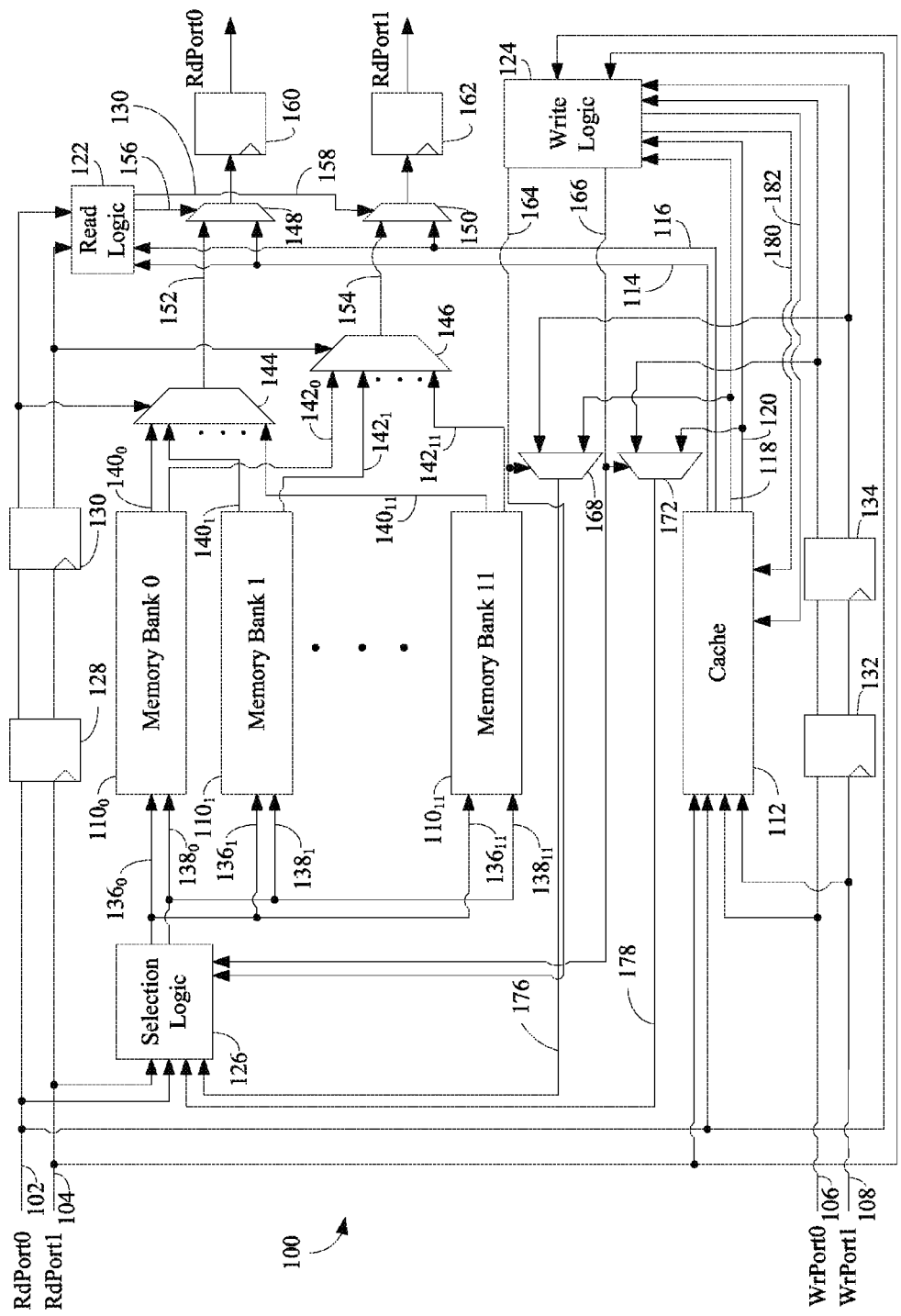
FIG. 1 is a block diagram of a memory in accordance with an embodiment.

FIG. 1 is a block diagram of a QCDP memory 100 in accordance with one embodiment. As shown in FIG. 1, QCDP memory 100 includes a first read port 102 (RdPort0), a second read port 104 (RdPort1), a first write port 106 (WrPort0), a second write port 108 (WrPort1), a plurality of memory banks $110_0$-$110_{11}$, at least one cache 112, read logic 122, write logic 124, and selection logic 126. First read port 102, second read port 104, first write port 106, and second write port 108 are each coupled, either directly or indirectly, to memory banks $110_0$-$110_{11}$ and at least one cache 112.

First read port 102 is configured to receive a plurality of signals associated with a first incoming read operation via a plurality of read signal lines, and second read port 104 is configured to receive a plurality of signals associated with a second incoming read operation via a plurality of read signal lines. The plurality of read signal lines includes a clock signal line, a read valid signal line, and read address signal lines. The plurality of read signal lines may include other signal lines as well.

The clock signal line is utilized to carry a clock signal that controls the timing of the incoming read operations. The read valid signal line is utilized to carry a read valid signal that, when asserted, indicates that an incoming read operation is being received by QCDP memory 100. The read address signal lines are configured to carry read address signals that identify a target memory location in QCDP memory 100 from which data is to be read. A first set of one or more read address signals identify one of memory banks $110_0$-$110_{11}$ from which data is to be read and thus may be referred to as "bank address signals", and a second set of one or more read address signals identify a location within the identified memory bank and thus may be referred to as "address index signals".

For example, suppose that QCDP memory 100 includes twelve memory banks $110_0$-$110_{11}$ (as depicted in FIG. 1), and each of memory banks $110_0$-$110_{11}$ is configured to include 2048 rows. In this example, address signal lines [14:11] may be designated as the bank address signals that are used to identify the memory bank to be read, and address signal lines [10:0] may be designated as the index address signals that are used to identify the row in the identified memory bank to be read.

First read port 102 is also configured to output a plurality of read data signals associated with a first incoming read operation via a plurality of read data signal lines, and second read port 104 is also configured to output a plurality of read data signals associated with the second incoming read operation via a plurality of read data signal lines. The plurality of read data signal lines associated with first read port 102 are utilized to output data from QCDP memory 100 that is read via the first incoming read operation, and the plurality of data signal lines associated with second read port 104 are utilized to output data from QCDP memory 100 that is read via the second incoming read operation.

First read port 102 may also be configured to output a read output enable signal via a read output enable signal line, and second read port 102 may also be configured to output a read output enable signal via a read output enable signal line. The read output enable signal associated with first read port 102 may indicate, when asserted, that data being output via the read data signals lines of first read port 102 is valid. The read output enable signal associated with second read port 104 may indicate, when asserted, that data being output via the read data signals lines of second read port 104 is valid.

First write port 106 is configured to receive a plurality of write signals associated with a first incoming write operation via a plurality of write signal lines, and second write port 108 is configured to receive a plurality of write signals associated with a second incoming write operation via a plurality of write signal lines. The plurality of write signals lines includes a clock signal line, a write valid signal line, write address signal lines, and write data lines. The plurality of write signal lines may include other signal lines as well.

The clock signal line is configured to carry a clock signal that controls the timing of the incoming write operations. In one embodiment, the clock signal for an incoming write operation is received via the same clock signal line that is used to receive the clock signal for an incoming read operation. In another embodiment, the clock signal for an incoming write operation is received via a different clock signal line than that used to receive the clock signal for an incoming read operation. The write valid signal line is utilized to carry a write valid signal that, when asserted, indicates that an incoming write operation is being received by QCDP memory 100. In one embodiment, QCDP memory 100 includes a single valid signal line that is utilized to carry a single valid signal that identifies whether an incoming read operation or an incoming write operation is being received. For instance, when asserted high, the valid signal may indicate that an incoming write operation is being received. When asserted low, the valid signal may indicate that an incoming read operation is being received. The write data lines are utilized to carry data that is to be written to QCDP memory 100, which may be referred to as "write data". The write address signal lines are utilized to carry write address signals that identify a target memory location in QCDP memory 100 to which data is to be written. For example, a first set of one or more write address signals identify one of memory banks $110_0$-$110_{11}$ to which data is to be written and thus may be referred to as "bank address signals", and a second set of one or more write address signals identify a location within the identified memory bank to be written and thus may be referred to as "address index signals".

In the example QCDP memory shown in FIG. 1, write address signals may be utilized in a similar manner to read address signals. That is, address signal lines [14:11] may be designated as the bank address signals that are used to identify the memory bank to be written, and address signal lines [10:0] may be designated as the index address signals that are used to identify the row in the identified memory bank to be written.

In one embodiment, QCDP memory 100 includes a single set of address signal lines that are configured to carry both the read address signals and the write address signals. Similarly, QCDP memory 100 may also include a single set of data signal lines that are configured to carry both the data to be read from QCDP memory 100 and the data to be written to QCDP memory 100. In accordance with such an embodiment, the read output enable signal may be used to differentiate the data being carried via the single set of data signal lines. For example, the read output enable signal, when asserted, may indicate that data read from QCDP memory 100 is being carried via the single set of data signal lines. When de-asserted, the read output enable signal may indicate that data to be written to QCDP memory 100 is being carried via the single set of data signal lines.

As shown in FIG. 1, QCDP memory 100 may be configured to include twelve memory banks $110_0$-$110_{11}$. However, persons skilled in the relevant art(s) will recognize that any number of memory banks may be included in QCDP memory 100.

Each of memory banks $110_0$-$110_{11}$ may include memory cells that are arranged in rows and columns. Each of memory banks $110_0$-$110_{11}$ may be configured to include the same number of memory cells. Each memory cell may be configured to store a bit of data and has a unique address defined by the intersection of a row and a column. Data may be read from or written to a row of any of memory banks $110_0$-$110_{11}$ via an incoming read or write operation, respectively.

For an incoming read operation, the read address signals received via read ports 102, 104 may be input into selection logic 126. Selection logic 126 uses the read address signals (e.g., the bank address signals) to identify from which one of memory banks $110_0$-$110_{11}$ data is to be read and outputs a bank select signal (e.g., via signal lines $136_0$-$136_{11}$ if the incoming read operation was received via first read port 102 or via signal lines $138_0$-$138_{11}$ if the incoming read operation was received via second read port 104) that selects the identified memory bank to be read. Selection logic 126 may also forward the read address signals (e.g., the index address signals) to the identified memory bank to indicate which row within the identified memory bank is to be selected and read for the incoming read operation.

For an incoming write operation, the write address signals received via write ports 106, 108 may be input into selection logic 126. Selection logic 126 uses the write address signals (e.g., the bank address signals) to identify to which one of memory banks $110_0$-$110_{11}$ data is to be written and outputs the bank select signal (e.g., via signal lines $136_0$-$136_{11}$ or $138_0$-$138_{11}$) that selects the identified memory bank to be written. Selection logic 126 may forward the write address signals (e.g., the index address signals) to the identified memory bank to indicate which row within the identified memory bank is to be selected and written to for the incoming write operation.

Selection logic 126 may output the bank select signal for an incoming write operation received via first write port 106 via signal lines $136_0$-$136_{11}$ and may output the bank select signal for an incoming write operation received via second write port 108 via signal lines $138_0$-$138_{11}$. However, there may be instances when selection logic 126 outputs the bank select signal for an incoming write operation received via first write port 106 via signal lines $138_0$-$138_{11}$ and outputs the bank select signal for an incoming write operation received via second write port 108 via signal lines $136_0$-$136_{11}$. For example, suppose that an incoming read operation received via first read port 102 and an incoming write operation received via first write port 106 are received during the same clock cycle. In this example, selection 126 outputs the bank selection signal for the incoming read operation via signal lines $136_0$-$136_{11}$ and outputs the bank selection signal for the incoming write operation via signal lines $138_0$-$138_{11}$. In another example, suppose that an incoming read operation received via second read port 102 and an incoming write operation received via second write port 106 are received during the same clock cycle. In this example, selection 126 outputs the bank selection signal for the incoming read operation via signal lines $138_0$-$138_{11}$ and outputs the bank selection signal for the incoming write operation via signal lines $136_0$-$136_{11}$.

Each of memory banks $110_0$-$110_{11}$ may be dual-ported, where each port is operable to receive either one incoming read operation or one incoming write operation during the same clock cycle. Accordingly, each of memory banks $110_0$-$110_{11}$ may receive two incoming read operations, two incoming write operations, or one incoming read operation and one incoming write operation during the same clock cycle. Furthermore, because QCDP memory 100 may be configured to receive two incoming read operations and two incoming write operations during the same clock cycle, any four given memory banks $110_0$-$110_{11}$ may be accessed during the same clock cycle. Accordingly, selection logic 126 may be configured to output four bank select signals (e.g., via signal lines $136_0$-$136_{11}$ and signal lines $138_0$-$138_{11}$) to either the same or different memory banks during the same clock cycle. Furthermore, because each of memory banks $110_0$-$110_{11}$ supports two incoming read operations, each of memory banks $110_0$-$110_{11}$ may be configured to output data via two data output signal lines $140_0$-$140_{11}$, $142_0$-$142_{11}$, respectively. Data that is output via data output signal lines $140_0$-$140_{11}$ corresponds to data read for an incoming read operation received via first read port 102, and data that is output via data output signal lines $142_0$-$142_{11}$ corresponds to data read for an incoming read operation received via second read port 104.

Data that is output via data output signal lines $140_0$-$140_{11}$ is input into a multiplexer (mux) 144. Mux 144 is configured to select the memory bank from which data is read out for an incoming read operation received via first read port 102. For example, mux 144 uses bank address signals received via first read port 102 to select which data output signal line from among $140_0$-$140_{11}$ is to provide the data that is read out. The data received via the selected data output signal is provided via a signal line 152 to mux 148, the operation of which is described below in reference to the operations of read logic 122.

Data that is output via data output signal lines $142_0$-$142_{11}$ is input into mux 146. Mux 146 is configured to select the memory bank from which data is read out for an incoming read operation received via second read port 104. For example, mux 146 uses bank address signals received via second read port 104 to select which data output signal line from among $142_0$-$142_{11}$ is to provide the data that is read out. The data received via the selected data output signal is provided via a signal line 154 to mux 150, the operation of which is described below in reference to the operations of read logic 122.

In one embodiment, incoming write operations that are configured to write data to the same target memory bank from which two incoming read operations are configured to read data are blocked if the incoming write operations are received during the same clock cycle as the two incoming read operations. Incoming write operations are blocked during these instances because no memory bank ports (shown as being coupled to signal lines $136_0$-$136_{11}$ and signal lines $138_0$-$138_{11}$ in FIG. 1) are available to receive the write control signals and the write data signals while the read operations (and/or write operations) are being performed. Write data for incoming write operations that are blocked may be stored as cache lines in at least one cache 112.

Figure 2:
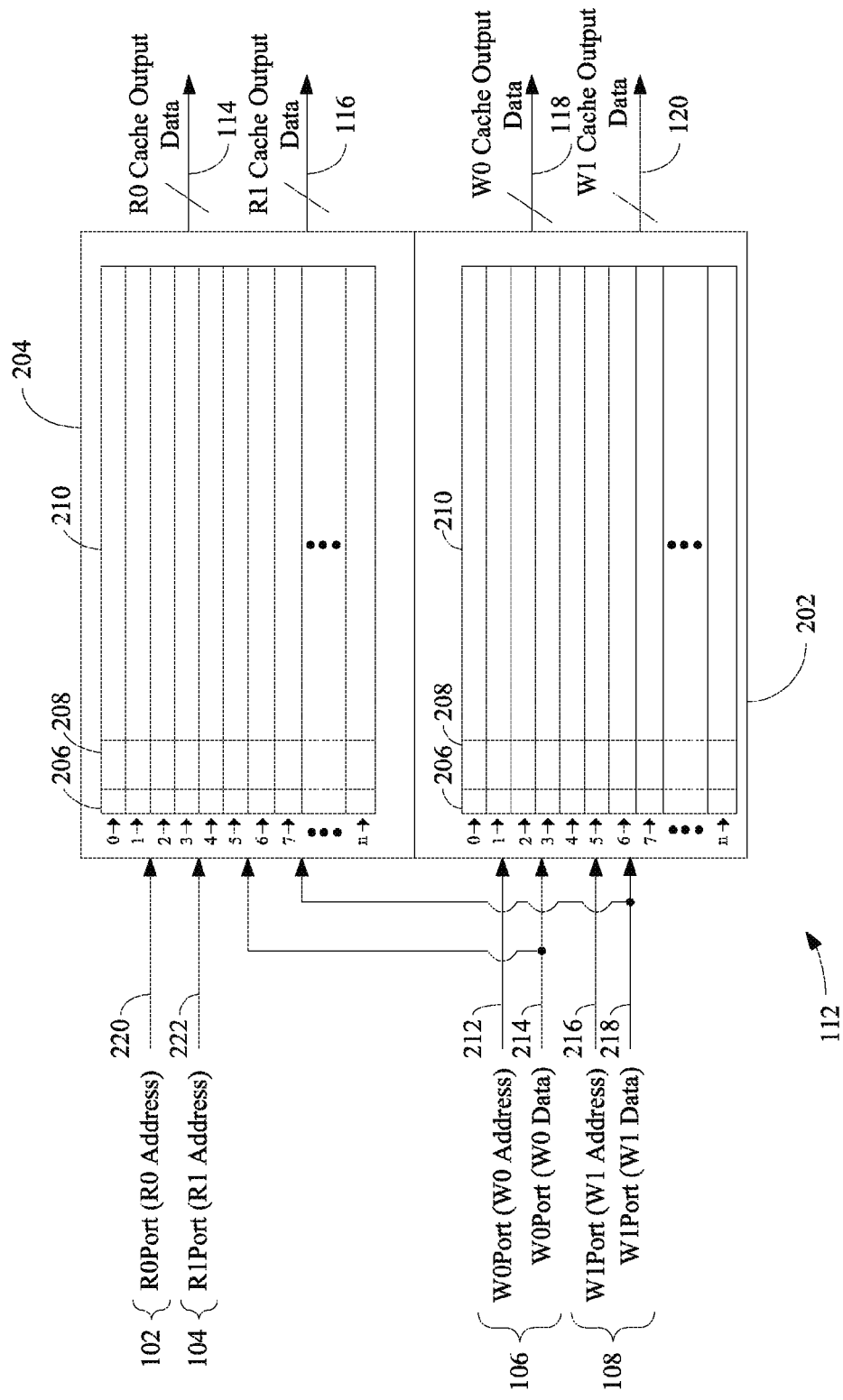
FIG. 2 is a block diagram of a cache that may be used to implement a memory in accordance with an embodiment.

FIG. 2 is a block diagram cache 112 in accordance with one embodiment. As shown in FIG. 2, cache 112 includes two register files 202, 204 that each contain 0-(n-1) cache lines, where n is equal to the number of rows in each of memory banks $110_0$-$110_{11}$. Register file 202 is configured to receive write address signals 212 and write data signals 214 for an incoming write operation received via first write port 106. Register file 202 is also configured to receive write address signals 216 and write data signals 218 for an incoming write operation received via second write port 108. Register file 204 is configured to receive read address signals 220 for an incoming read operation received via first read port 102 and read address signals 222 for an incoming read operation received via second read port 104. Register file 204 is also configured to receive write data signals 214 and 218. This is because register file 204 is configured to be a mirrored version of register file 202. That is, register file 204 and register file 202 are managed such that they include the same contents. Accordingly, when write data is written to register file 202, the same write data is also written to register file 204 to maintain data consistency. Each of write address signals 212, write address signals 216, read address signals 220, and read address signals 222 include bank address signals and index address signals as described above.

Each cache line in register files 202, 204 may correspond to a location in any of memory banks $110_0$-$110_{11}$ (e.g., a row within one of memory banks $110_0$-$110_{11}$). A cache line may be accessed using the index address signals received via first read port 102, second read port 104, first write port 106, or second write port 108. Because data is mirrored between register files 202 and 204, cache lines included in register file 202 and the corresponding cache lines included in register file 204 represent the same locations within memory banks $110_0$-$110_{11}$.

As shown in FIG. 2, each cache line may include a valid field 206, a tag field 208, and/or a data field 210. Data field 210 may store data that is to be written to a target memory bank for an associated blocked write operation. Valid field 206 may store a value indicating whether the data stored in a corresponding data field 210 is valid (i.e., not stale). For example, a value of '1' may indicate that data stored in a corresponding data field 210 is valid, whereas a value of '0' may indicate that data stored in a corresponding data field 210 is not valid. Tag field 208 may store a value that represents a target memory bank to which data in a corresponding data field 210 is to be written to for an associated blocked write operation. For example, suppose that QCDP memory 100 includes twelve memory banks $110_0$-$110_{11}$ (as depicted in FIG. 1). In this example, tag field 208 may store a 4-bit value equal to bank address signals received via first read port 102 or second read port 104. In one embodiment, the invalidity of a cache line may be indicated by a value stored in tag field 208, thereby eliminating the need for valid field 206. For instance, using the example above, only the values 0x0-0xB are needed to represent memory banks $110_0$-$110_{11}$, respectively. As such, any of the values that are not used to represent memory banks $110_0$-$110_{11}$ (i.e., 0xC, 0xD, 0xE, or 0xF) could be used to indicate that data stored in a corresponding data field 210 is invalid.

Cache lines may be retrieved via read and write cache lookup operations. The mirrored nature of register files 202 and 204 advantageously allows the read and write cache lookup operations to be received during the same clock cycle. That is, two read cache lookup operations and two write cache lookup operations may all be received during the same clock cycle. Read cache lookup operations are directed to register file 204 and write cache lookup operations are directed to register file 202. Although the read and write lookup operations may be received during the same clock cycle, the lookup operations may take one or more clock cycles to complete.

Read and write cache lookup operations are performed on cache 112 in response to receiving incoming read and write operations, respectively. A particular cache line may be selected using the index address signals received via one of first read port 102, second read port 104, first write port 106, or second write port 108. Contents of the selected cache line may be output from cache 112 via one of signal lines 114, signal lines 116, signal lines 118, or signal lines 120. For example, contents from a cache line selected in response to receiving an incoming read operation via first read port 102 may be output via signal lines 114 and input into mux 148 (shown in FIG. 1). Contents from a cache line selected in response to receiving an incoming read operation via second read port 104 may be output via signal lines 116 and input into mux 150 (shown in FIG. 1). Contents from a cache line selected in response to receiving an incoming write operation via first write port 106 may be output via data signal lines 118 and input into mux 168 (shown in FIG. 1). Contents from a cache line selected in response to receiving an incoming write operation via second write port 108 may be output via data signal lines 120 and input into mux 172 (shown in FIG. 1).

Referring again to FIG. 1, read logic 122 is coupled to first read port 102, second read port 104, and cache 112 (via signal lines 114 and signal lines 116). Read logic 122 may be configured to determine whether data for an associated incoming read operation is to be read from cache 112 or one of memory banks $110_0$-$110_{11}$. Read logic 122 determines that the data is to be read from cache 112 if a cache line corresponding to a location from which data is to be read from a memory bank targeted by an incoming read operation exists in cache 112.

Read logic 122 may be configured to determine that such a cache line exists in cache 112 if valid field 206 of the selected cache line (received either via signal line 114 or signal line 116) contains a value that indicates that the selected cache line is valid and/or the bank address signals received via the read port from which the incoming read operation was received (i.e., first read port 102 or second read port 104) are equal to the value stored in tag field 208 of the selected cache line. Read logic 122 may be configured to determine that such a cache line does not exist in cache 122 if either valid field 206 of the selected cache line does not contain a value that indicates that the selected cache line is valid or the bank address signals are not equal to the value stored in tag field 208 of the selected cache line.

In response to determining that such a cache line exists in cache 112, read logic 122 asserts a signal on signal line 156 (if the incoming read operation was received via first read port 102) or signal line 158 (if the incoming read operation was received via second read port 104). In response to determining that such a cache line does not exist in cache 112, read logic 122 de-asserts a signal on signal line 156 (if the incoming read operation was received via first read port 102) or de-asserts a signal on signal line 158 (if the incoming read operation was received via second read port 104).

Mux 148 uses signal line 156 to select between data read from cache 122 (via signal lines 114) or data read from one of memory banks $110_0$-$110_{11}$. For example, when a signal on signal line 156 is asserted, mux 148 may output data received from cache 112. When a signal on signal line 156 is de-asserted, mux 148 may output data received from one of memory banks $110_0$-$110_{11}$ (via signal lines 152). Mux 148 may output the selected data via the read data signal lines of first read port 102. In one embodiment, the data output via first read port 102 is flopped in a scan test flip flop 160 to assist in debug of the QCDP memory 100 before being output via the read data signal lines of first read port 102.

Mux 150 uses signal line 158 to select between data read from cache 122 (via signal lines 116) or data read from one of memory banks $110_0$-$110_{11}$. For example, when a signal on signal line 158 is asserted, mux 150 may output data received from cache 112. When a signal on signal line 158 is de-asserted, mux 150 may output data received from one of memory banks $110_0$-$110_{11}$ (via signal lines 154). Mux 150 may output the data via the read data signal lines of second read port 104. In one embodiment, the data output via second read port 104 is flopped in a scan test flip flop 162 to assist in debug of the QCDP memory 100 before being output via the read data signals of second read port 104.

As previously mentioned, cache lookup operations may take one or more clock cycles. In the example implementation shown in FIG. 1, cache lookup operations take two clock cycles. Accordingly, signals received via read ports 102, 104 are delayed two clock cycles (via flip flops 128 and 130) before being received by read logic 122, mux 144, and mux 146 to enable these signals to be synchronized with the data being received from cache 112 via signal lines 114 and 116. Additional details concerning the operation of read logic 122 will be provided below in reference to FIGS. 6-7.

Write logic 124 is coupled to first read port 102, second read port 104, first write port 106, first write port 108, and cache 112 (via signal lines 118 and signal lines 120). Write logic 124 may be configured to determine whether an incoming write operation is blocked by at least two incoming read operations (or one incoming read operation and another incoming write operation). When determining whether an incoming write operation is blocked by two incoming read operations, write logic 124 may be configured to determine that an incoming write operation is blocked by comparing the bank address signals of the two incoming read operations (received via first read port 102 and second read port 104) and the bank address signals of the incoming write operation (receiving via first write port 106 or second write port 108). If the bank address of an incoming write operation is the same as the bank addresses of the two incoming read operations, then write logic 124 determines that the incoming write operation is blocked. When determining whether an incoming write operation is blocked by one incoming read operation and another incoming write operation, write logic 124 may be configured to determine that an incoming write operation is blocked by comparing the bank address signals of the one incoming read operation (received via first read port 102 or second read port 104), the bank address signals of the other incoming write operation (received via first write port 106 or second write port 108), and the bank address signals of the incoming write operation (receiving via first write port 106 or second write port 108). In response to determining that an incoming write operation is blocked, write logic 124 is configured to write the data for the associated incoming write operation to cache 112.

When writing data to cache 112, write logic 124 first determines whether a cache line corresponding to a location to be written to in a memory bank targeted by the incoming write operation exists in cache 112. Write logic 124 may determine that such a cache line exists in cache 112 if valid field 206 of the cache line selected via the cache lookup operation (received either via signal lines 118 or signal lines 120) contains a value that indicates that the selected cache line is valid and/or the bank address signals received via the write port from which the incoming write operation was received (i.e., first write port 106 or second write port 108) are equal to the value stored in tag field 208 of the selected cache line. Write logic 124 may be configured to determine that such a cache line does not exist in cache 122 if either valid field 206 of the selected cache line does not contain a value that indicates that the selected cache line is valid or the bank address signals are not equal to the value stored in tag field 208 of the selected cache line.

In response to determining that the selected cache line does not correspond to the location to be written to in the targeted memory bank, write logic 124 may be configured to preserve the data stored in the selected cache line (if such data exists) by writing the data to the memory bank indicated in tag field 208 of the selected cache line. Write logic 124 may perform this operation by asserting a signal on signal line 164 (if the incoming write operation was received via write read port 106) or a signal on signal line 166 (if the incoming write operation was received via second write port 108).

Mux 168 uses the signal received via signal line 164 to select the data to be written to memory banks $110_0$-$110_{11}$ in response to receiving an incoming write operation via first write port 106. Mux 168 selects between data received from cache 112 via signal lines 118 (such data including a tag value stored in tag field 208 and write data stored in data field 210) or write data received via first write port 106. For example, when a signal on signal line 164 is asserted, mux 168 outputs the data received from cache 112. When a signal on signal line 164 is de-asserted, mux 168 outputs the write data received via first write port 106. The selected write data is output from mux 168 via signal lines 176.

Mux 172 uses the signal received via signal line 166 to select the data to be written to memory banks $110_0$-$110_{11}$ in response to receiving an incoming write operation via second write port 108. Mux 172 selects between data received from cache 112 via signal lines 120 (such data including a tag value stored in tag field 208 and write data stored in data field 210) or write data received via second write port 108. For example, when a signal on signal line 166 is asserted, mux 172 outputs data received from cache 112. When a signal on signal line 166 is de-asserted, mux 172 outputs the write data received via second write port 108. The selected write data is output from mux 172 via signal lines 178.

Once the data has been preserved (i.e., written to the target memory bank), write logic 124 writes the data associated with the blocked incoming write operation into the selected cache line (e.g., via signal line 180 if the blocked incoming write operation was received via first write port 106 or signal line 182 if the blocked incoming write operation was received via second write port 108).

In response to determining that the selected cache line does correspond to the location to be written to in the targeted memory bank, write logic 124 may be configured to overwrite the data stored in the selected cache line (if such data exists) with the data associated with the blocked incoming write operation.

In response to determining that an incoming write operation is not blocked by at least two incoming read operations (or one incoming read operation and another incoming write operation), write logic 124 may be configured to write data for the incoming write operation to the target memory bank specified by the incoming write operation. Write logic 124 may perform this operation for an incoming write operation received via first write port 106 by de-asserting a signal on signal line 164, thereby enabling mux 168 to output write data received via first write port 106. Write logic 124 may perform this operation for an incoming write operation received via second write port 108 by de-asserting a signal on signal line 166, thereby enabling mux 172 to output write data received via second write port 108. Write logic 124 determines the target memory bank using bank address signals received via first write port 106 or second write port 108.

As previously mentioned, cache lookup operations may take one or more clock cycles. In the example implementation shown in FIG. 1, cache lookup operations take two clock cycles. Accordingly, signals received via write ports 106, 108 are delayed two clock cycles (via flip flops 132 and 134) before being received by write logic 124 to enable these signals to be synchronized with the data being received from cache 112 via signal lines 118 and 120. Additional details concerning the operation of write logic 124 will be provided below in reference to FIGS. 5 and 8-9B.

Selection logic 126 may be further configured to receive data via signal lines 176 and signal lines 178. Selection logic 126 may also be configured to receive signals via signal line 164 and signal line 166. Upon receiving a signal via signal line 164, selection logic 126 may be configured to utilize such signal to determine whether the write data received via signal lines 176 is write data from cache 112 or first write port 106. For example, if the signal on signal line 164 is asserted, then selection logic 126 may be configured to determine that write data is being received from cache 112. In response, selection logic 126 may use the tag value included in the data received via signal lines 176 to identify a memory bank to which the write data is to be written and to assert the proper bank select signal via one of signal lines $136_0$-$136_{11}$. If the signal on signal line 164 is de-asserted, then selection logic 126 may be configured to determine that write data is being received from first write port 106. In response, selection logic 126 may use the bank address signals received from first write port 106 to identify the memory bank to which the write data is to be written and to assert the proper bank select signal via one of signal lines $136_0$-$136_{11}$.

Upon receiving a signal via signal line 166, selection logic 126 may be configured to determine whether the write data received via signal lines 178 is write data from cache 112 or second write port 108. For example, if the signal on signal line 166 is asserted, then selection logic 126 may be configured to determine that write data is being received from cache 112. In response, selection logic 126 may use the tag value included in the data received via signal lines 178 to identify a memory bank to which the write data is to be written and to assert the proper bank select signal via one of signal lines $138_0$-$138_{11}$. If the signal on signal line 166 is de-asserted, then selection logic 126 may be configured to determine that write data is being received from second write port 108. In response, selection logic 126 may use the bank address signals received from second write port 108 to identify the memory bank to which the write data is to be written and to assert the proper bank select signal via one of signal lines $138_0$-$138_{11}$.

It is noted that while the embodiments described above describe that an incoming write operation may be blocked by two incoming read operations (or one incoming read operation and another incoming write operation), in one embodiment, an incoming write operation may be blocked by a single incoming read operation that is received during the same clock cycle as the incoming write operation.

Figure 3:
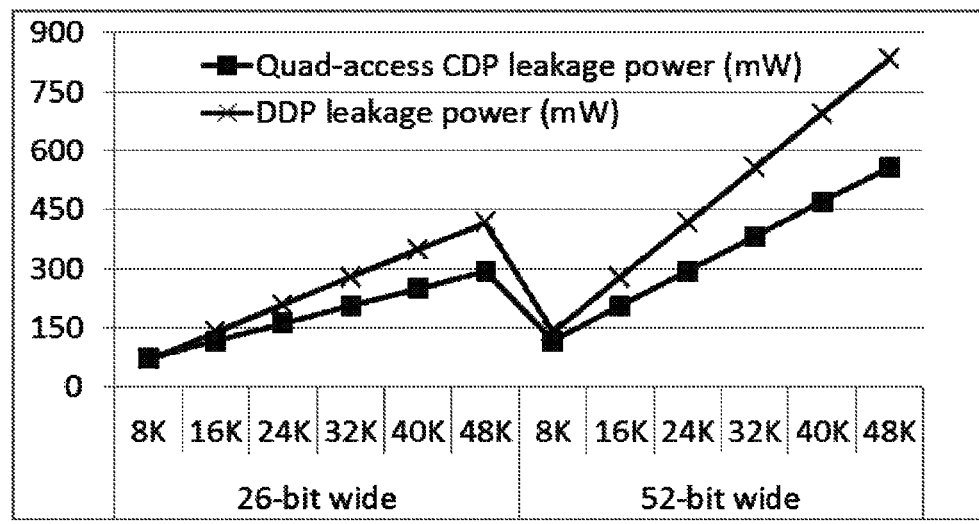
FIGS. 3 and 4 depict graphs that illustrate the advantages of a memory in accordance with an embodiment as compared to previous solutions.
Figure 4:
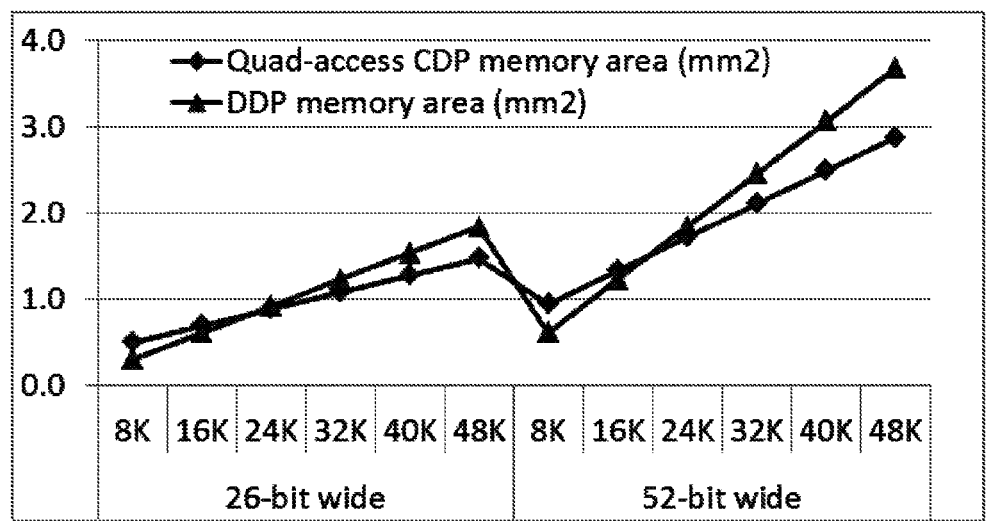

FIGS. 3 and 4 depict graphs that illustrate the advantages of a QCDP memory in accordance with an embodiment as compared to previous solutions. In particular, FIG. 3 depicts a graph 300 that shows the leakage power of a QCDP memory in accordance with an embodiment as compared to that of a DDP implementation in a 40G manufacturing process for various bit widths and memory depth combinations. As can be seen from FIG. 3, for all comparable bit width/memory depth combinations, the QCDP memory consumes essentially the same or less power than the DDP implementation. FIG. 4 depicts a graph 400 that shows the area required to implement the QCDP memory as compared to that required by a DDP implementation in a 40G manufacturing process for various bit widths and memory depth combinations. As can be seen from FIG. 4, for the majority of bit width/memory depth combinations, the QCDP memory requires less area than the DDP implementation.

Figure 5:
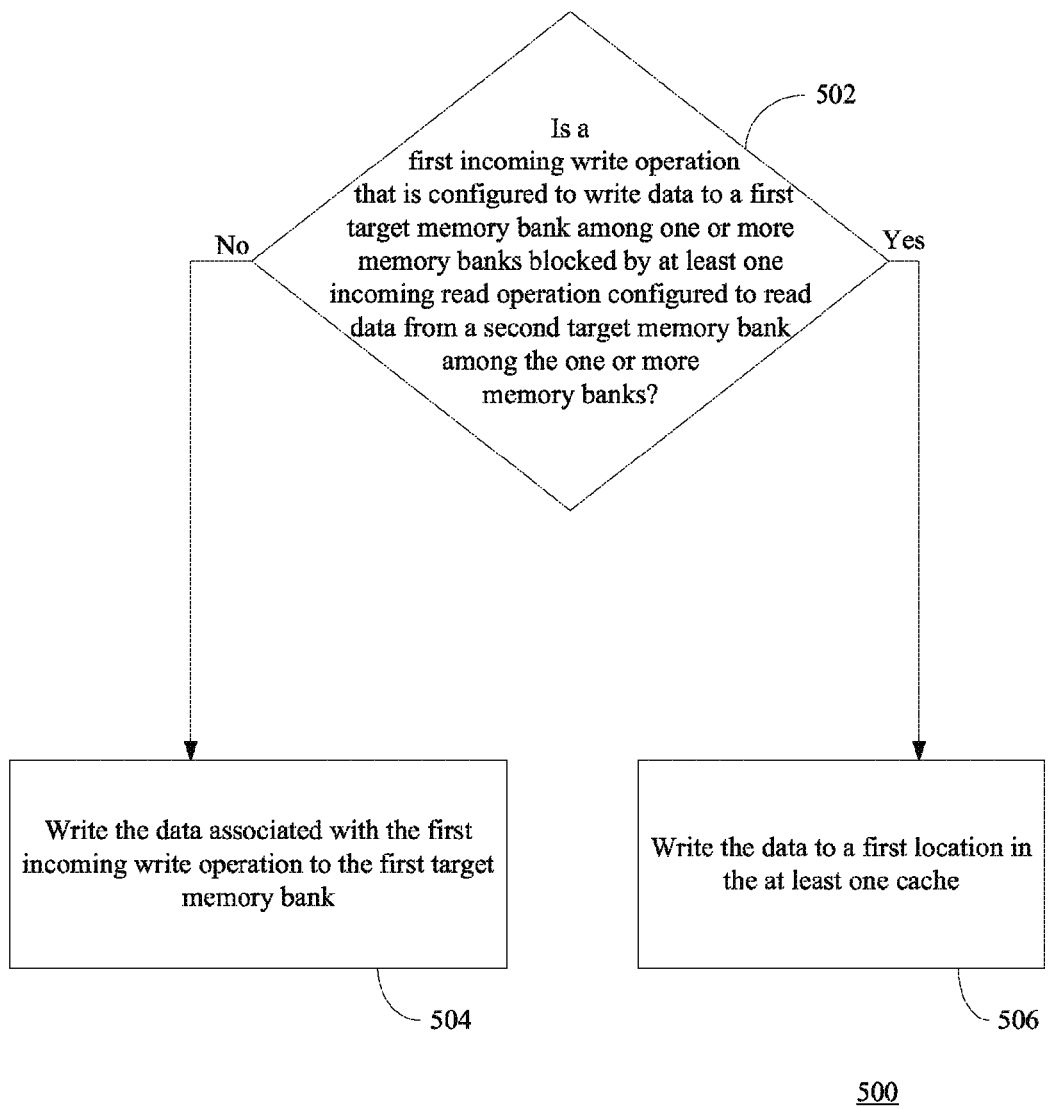
FIG. 5 depicts a flowchart of an example method for determining whether write data is to be written to at least one cache or to one of one or more memory banks in accordance with an embodiment.

FIG. 5 depicts a flowchart 500 of an example method for determining whether write data is to be written to at least one cache, such as cache 112, or one of one or more memory banks, such as memory banks $110_0$-$110_{11}$, in accordance with an embodiment. The method of flowchart 500 will now be described with continued reference to example QCDP memory 100 of FIG. 1, although the method is not limited to that implementation.

As shown in FIG. 5, the method of flowchart 500 begins at step 502, in which write logic 124 determines whether a first incoming write operation that is configured to write data to a first target memory bank among one or more memory banks $110_0$-$110_{11}$ is blocked by at least one incoming read operation configured to read data from a second target memory bank among one or more memory banks $110_0$-$110_{11}$. Write logic 124 may determine that the first incoming write operation is blocked by the at least one incoming read operation if at least the first target memory bank and the second target memory bank are the same. If write logic 125 determines that the first incoming write operation is blocked, then flow continues to step 506. Otherwise, flow continues to step 504.

In the example embodiment shown in FIG. 1, write logic 124 may determine that an incoming write operation is blocked by at least two incoming read operations (or one incoming read operation and another incoming write operation) if the target memory bank associated with the incoming write operation and the target memory banks associated with the at least two incoming read operations (or the one incoming read operation and the other incoming write operation) are the same.

At step 504, the data associated with the first incoming write operation is written to the first target memory bank in response to write logic 124 determining that the first incoming write operation is not blocked by the at least one incoming read operation.

At step 506, the data associated with the first incoming write operation is written to a first location in cache 112 in response to write logic 124 determining the first incoming write operation is blocked by the at least one incoming read operation.

Figure 6:
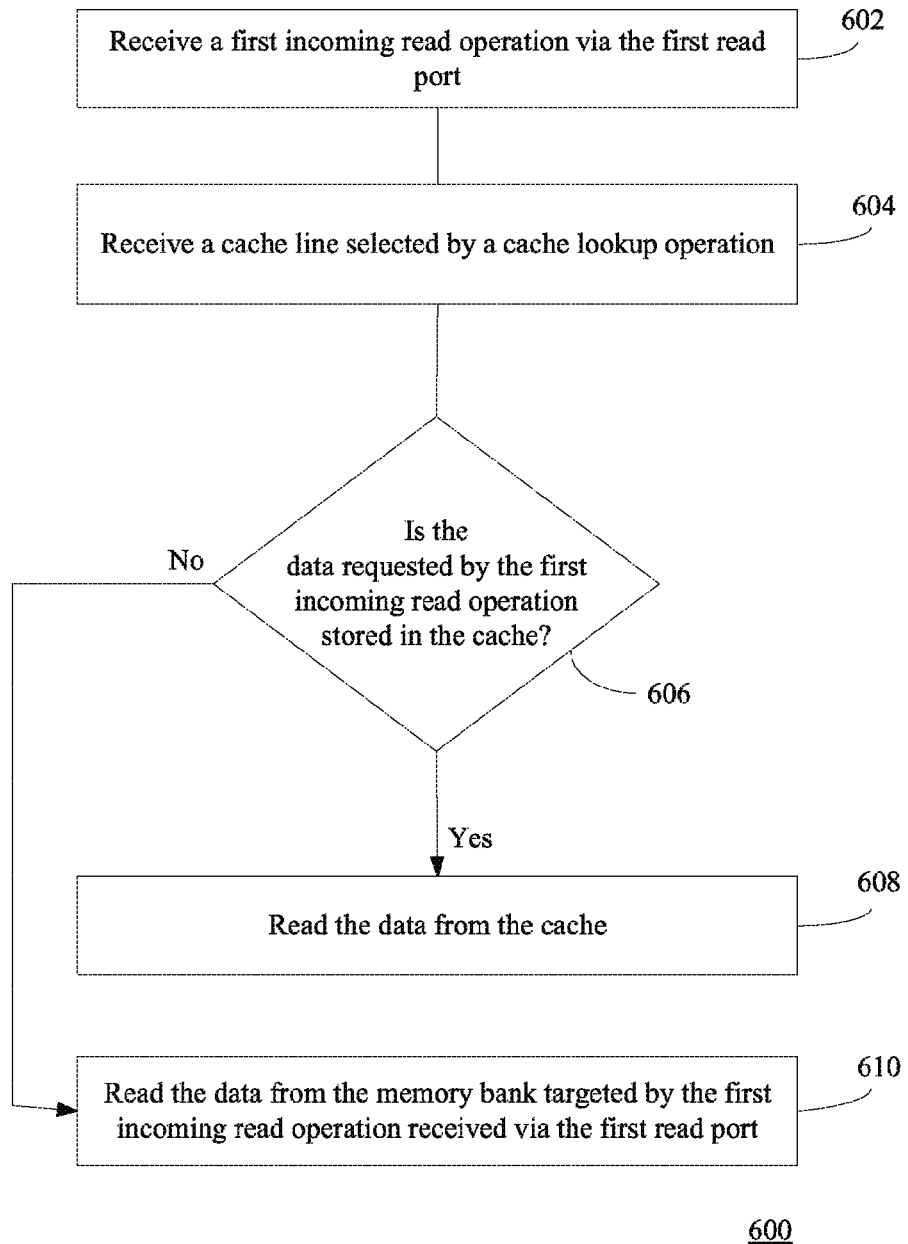
FIG. 6 depicts a flowchart of an example method performed by read logic in a memory in accordance with an embodiment in response to receiving an incoming read operation via a first read port.

FIG. 6 depicts a flowchart 600 of an example method that may be performed by read logic 122 in response to receiving an incoming read operation via first read port 102. The method of flowchart 600 will now be described with continued reference to QCDP memory 100 of FIG. 1, although the method is not limited to that implementation.

As shown in FIG. 6, the method of flowchart 600 begins at step 602, in which QCDP memory 100 receives a first incoming read operation via first read port 102.

At step 604, read logic 122 receives a cache line that is selected by a cache lookup operation that is performed on cache 112. The cache line may be selected using index address signals received via first read port 102.

At step 606, read logic 122 determines whether the data requested by the first incoming read operation is stored in cache 112. Read logic 122 makes this determination by determining whether the selected cache line corresponds to a location from which data is to be read from a memory bank targeted by the first incoming read operation. Read logic 122 may determine that the selected cache line corresponds to the location from which data is to be read from the memory bank targeted by the first incoming read operation by determining that valid field 206 of the selected cache line contains a value that indicates that the selected cache line is valid and/or the bank address signals received via first read port 102 are equal to the value stored in tag field 208 of the selected cache line. Read logic 122 may determine that the selected cache line does not correspond to the location from which data is to be read from the memory bank targeted by the first incoming read operation by determining that valid field 206 of the selected cache line contains a value that indicates that the selected cache line is invalid or the bank address signals received via first read port 102 are not equal to the value stored in tag field 208 of the selected cache line. If read logic 122 determines that the data requested by the first incoming read operation is stored in cache 112, flow continues to step 608. Otherwise, flow continues to step 610.

At step 608, the data is read from cache 112 in response to determining that the data requested by the first incoming read operation is stored in cache 112.

At step 610, the data is read from the memory bank targeted by the first incoming read operation (i.e., one of memory banks $110_0$-$110_{11}$) received via the first read port 102 in response to determining that the data requested by the first incoming read operation is not stored in cache 112.

Figure 7:
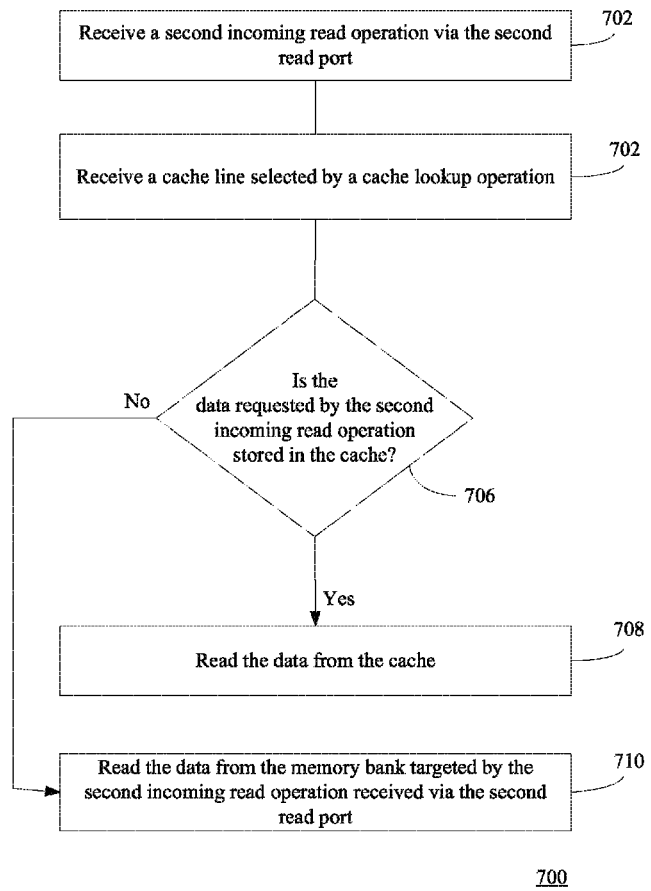
FIG. 7 depicts a flowchart of an example method performed by read logic in a memory in accordance with an embodiment in response to receiving an incoming read operation via a second read port.

FIG. 7 depicts a flowchart 700 of an example method that may be performed by read logic 122 in response to receiving an incoming read operation via second read port 104. The method of flowchart 700 will now be described with continued reference to QCDP memory 100 of FIG. 1, although the method is not limited to that implementation.

As shown in FIG. 7, the method of flowchart 700 begins at step 702, in which QCDP memory 100 receives a second incoming read operation via second read port 104.

At step 704, read logic 122 receives a cache line that is selected by a cache lookup operation that is performed on cache 112. The cache line may be selected using index address signals received via second read port 104.

At step 706, read logic 122 determines whether the data requested by the second incoming read operation is stored in cache 112. Read logic 122 makes this determination by determining whether the selected cache line corresponds to a location from which data is to be read from a memory bank targeted by the second incoming read operation. Read logic 122 may determine that the selected cache line corresponds to the location from which data is to be read from the memory bank targeted by the second incoming read operation by determining that valid field 206 of the selected cache line contains a value that indicates that the selected cache line is valid and/or the bank address signals received via second read port 104 are equal to the value stored in tag field 208 of the selected cache line. Read logic 122 may determine that the selected cache line does not correspond to the location from which data is to be read from the memory bank targeted by the second incoming read operation by determining that valid field 206 of the selected cache line contains a value that indicates that the selected cache line is invalid or the bank address signals received via second read port 104 are not equal to the value stored in tag field 208 of the selected cache line. If read logic 122 determines that the data requested by the second incoming read operation is stored in cache 112, flow continues to step 708. Otherwise, flow continues to step 710.

At step 708, the data is read from cache 112 in response to determining that the data requested by the second incoming read operation is stored in cache 112.

At step 710, the data is read from the memory bank targeted by the second incoming read operation (i.e., one of memory banks $110_0$-$110_{11}$) received via the second read port 104 in response to determining that the data requested by the second incoming read operation is not stored in cache 112.

It is noted that the first incoming read operation and second incoming read operation described above with respect to flowcharts 600 and 700 may be received during the same clock cycle or during different clock cycles. In the event that both the incoming read operation and the second incoming read operations are received during the same clock cycle, read logic 122 may concurrently perform the steps described above with respect to flowcharts 600 and 700.

Figure 8:
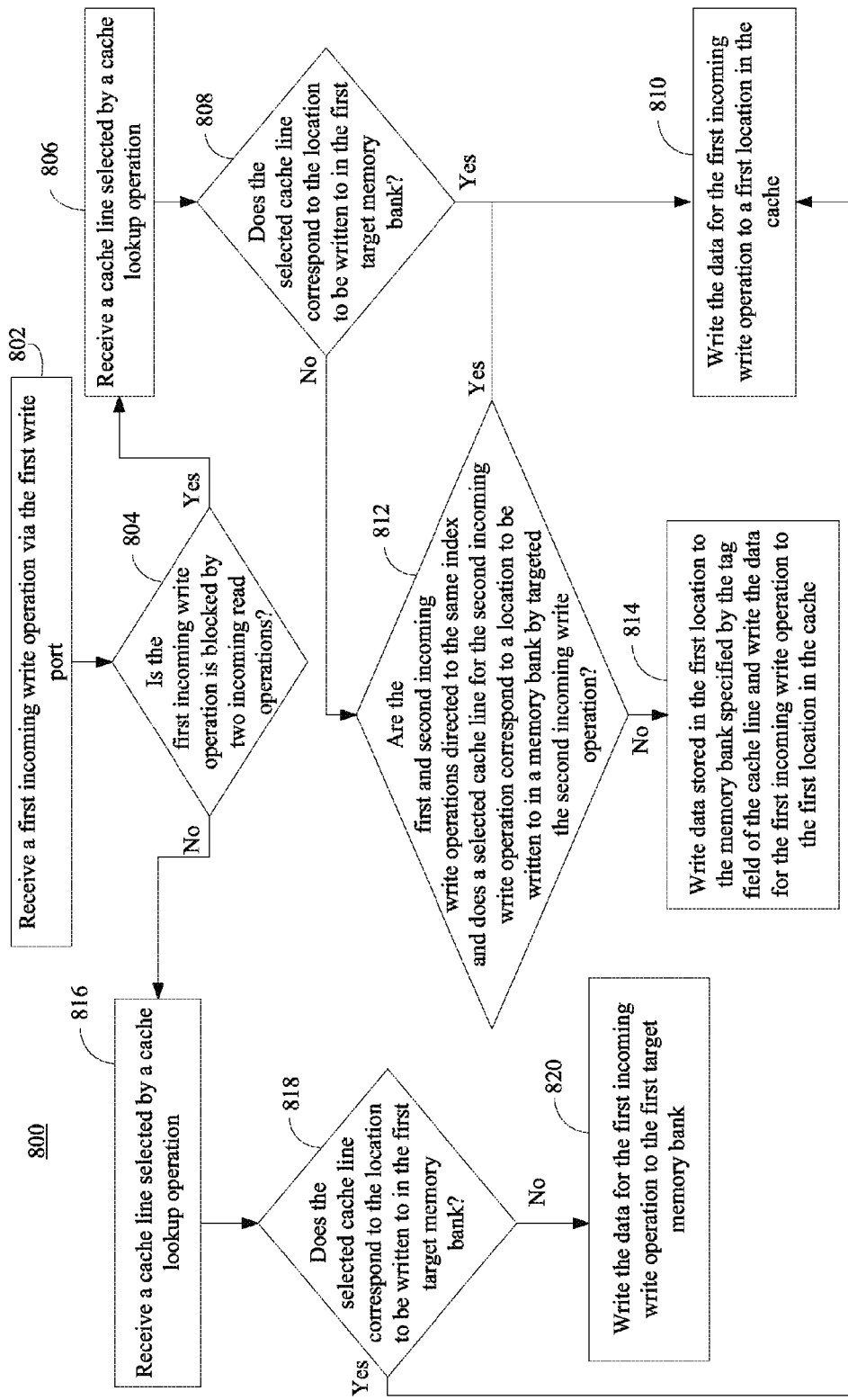
FIG. 8 depicts a flowchart of an example method performed by write logic in a memory in accordance with an embodiment in response to receiving a first incoming write operation configured to write data to a first target memory bank via a first write port.

FIG. 8 depicts a flowchart 800 of an example method that may be performed by write logic 124 in response to QCDP memory 100 receiving a first incoming write operation configured to write to a first target memory bank via first write port 106. The method of flowchart 800 will now be described with continued reference to QCDP memory 100 of FIG. 1, although the method is not limited to that implementation.

As shown in FIG. 8, the method of flowchart 800 begins at step 802, in which QCDP memory 100 receives a first incoming write operation via first write port 106.

At step 804, write logic 124 determines whether the first incoming write is blocked by at least two incoming read operations that are received during the same clock cycle as the first incoming write operation. Write logic 124 may determine that the first incoming write operation is blocked by the at least two incoming read operations if the first target memory bank is the same as the memory banks targeted by the at least two incoming read operations. If write logic 124 determines that the first incoming write operation is blocked by the at least two incoming read operations, then write logic 124 determines that the write data associated with the first incoming write operation is to be written into a first location of cache 112, and flow continues to step 806. Otherwise, write logic 124 determines that the write data associated with the first incoming write is to be written to the first target memory bank, and flow continues to step 818.

At step 806, write logic 124 receives a cache line that is selected by a cache lookup operation that is performed on cache 112. The cache line may be selected using index address signals received via first write port 106.

At step 808, write logic 124 determines whether the selected cache line corresponds to the location to be written to in the first target memory bank. Write logic 124 may determine that the selected cache line corresponds to the location to which data is to be written to in the first target memory bank by determining that valid field 206 of the selected cache line contains a value that indicates that the selected cache line is valid and/or the bank address signals received via first write port 106 are equal to the value stored in tag field 208 of the selected cache line. Write logic 124 may determine that the selected cache line does not correspond to the location to which data is to be written to in the first target memory bank by determining that valid field 206 of the selected cache line contains a value that indicates that the selected cache line is invalid or the bank address signals received via first write port 106 are not equal to the value stored in tag field 208 of the selected cache line. If write logic 124 determines that the selected cache line corresponds to the location to which data is to be written to in the first targeted memory bank, flow continues to step 810. Otherwise, flow continues to step 812.

At step 810, the write data for the first incoming write operation is written to a first location (i.e., the selected cache line) in cache 112 (for example, in data field 210 of the selected cache line). Along with writing the write data to the selected cache line, write logic 124 sets the value stored in the corresponding valid field 206 to '1' to indicate that the selected cache line is valid and/or stores the value of the bank address signals received via first write port 106 into the corresponding tag field 208.

At step 812, write logic 124 determines whether the first and second incoming write operations are directed to the same index and whether a selected cache line for the second incoming write operation corresponds to the location to be written to in the memory bank targeted by the second incoming write operation. Write logic 124 may determine whether the second incoming write operation is directed to the same index as the first incoming write operation by comparing the index address signals received via first write port 106 and the index address signals received via second write port 108. If the index address signals match, then the first and second incoming write operations are directed to the same index. If the index address signals do not match, then the first and second incoming write operations are not directed to the same index. Write logic 124 determines whether the selected cache line for the second incoming write operation corresponds to a location to be written to in the memory bank targeted by the second incoming write operation. If write logic 124 determines that a second incoming write operation is directed to the same index as the first incoming write operation and the selected cache line for the second incoming write operation corresponds to a location to be written to in the memory bank targeted by the second incoming write operation, then flow continues to step 810. Otherwise, flow continues to step 814.

At step 814, because the selected cache line does not correspond to the location to be written to in the first target memory bank, the selected cache line may contain data from a previously-blocked write operation. If the write data associated with first incoming write operation were to overwrite this data, the data would be lost. As a result, before the write data is written to the selected cache line, the data from the previously-blocked write operation stored in the selected cache line is written to the target memory bank specified by the value in tag field 208 of the selected cache line to preserve the data. Once this data is written to the target memory bank, write logic 124 sets the value stored in valid field 206 to '1' to indicate that the cache line is valid, stores the value of the bank address signals received via first write port 106 into tag field 208, and/or stores the write data associated with the first incoming write operation into data field 210.

At step 816, write logic 124 receives a cache line that is selected by a cache lookup operation that is performed on at least one cache 112. The cache line may be selected using index address signals received via first write port 106.

At step 818, write logic 124 determines whether the selected cache line corresponds to the location to be written to in the first target memory bank. Write logic 124 may determine that the selected cache line corresponds to the location to which data is to be written to in the first target memory bank by determining that valid field 206 of the selected cache line contains a value that indicates that the selected cache line is valid and/or the bank address signals received via first write port 106 are equal to the value stored in tag field 208 of the selected cache line. Write logic 124 may determine that the selected cache line does not correspond to the location to which data is to be written to in the first target memory bank by determining that valid field 206 of the selected cache line contains a value that indicates that the selected cache line is invalid or the bank address signals received via first write port 106 are not equal to the value stored in tag field 208 of the selected cache line. If write logic 124 determines that the selected cache line corresponds to the location to which data is to be written to in the first targeted memory bank, flow continues to step 810. Otherwise, flow continues to step 820.

In one embodiment, instead of writing the write data for the first incoming write operation to a first location in cache 112 at step 114, the data associated with the first incoming write operation is written to the target memory bank and the selected cache line is invalidated. Write logic 124 may invalidate the selected cache line by setting the value stored in valid field 206 of the selected cache line to '0'.

At step 820, in one embodiment, the data associated with the first incoming write operation is written to the target memory bank.

FIGS. 9A-9B depict flowcharts 900A and 900B that collectively represent an example method that may be performed by write logic 124 when a second incoming write operation configured to write data to a second target memory bank is received via second write port 108 and a first incoming write operation configured to write data to a first target memory bank is received via first write port 106 during the same clock cycle. The method of flowcharts 900A and 900B will now be described with continued reference to QCDP memory 100 of FIG. 1, although the method is not limited to that implementation.

As shown in FIG. 9A, the method of flowchart 900 begins at step 902, in which QCDP memory 100 receives a second incoming write operation via second write port 108.

At step 904, write logic 124 determines whether the second incoming write operation is also blocked by at least two incoming read operations that are received during the same clock cycle as the first incoming write operation. Write logic 124 may determine whether the second incoming write operation is also blocked by at least two incoming read operations if the second target memory bank is the same as the memory banks targeted by the at least two incoming read operations. If write logic 124 determines that the second incoming write operation is also blocked by the at least two incoming read operations, then write logic 124 determines that the write data associated with the second incoming write is to be written into a second location in cache 112, and flow continues to step 906. Otherwise, write logic 124 determines that the write data associated with the second incoming write operation is to be written to the second target memory bank, and flow continues to step 922 shown in FIG. 9B.

At step 906, write logic 124 determines whether the first and second incoming write operations are directed to the same target memory bank (which would mean that the first incoming write operation is also blocked by the two incoming read operations). If write logic 124 determines that the first and second incoming write operations are directed to the same target memory bank, then flow continues to step 908. Otherwise, flow continues to step 916.

At step 908, write logic 124 receives a cache line that is selected by a cache lookup operation that is performed on at least one cache 112. The cache line may be selected using index address signals received via second write port 108.

At step 910, write logic 124 determines whether the selected cache line corresponds to the location to be written to in the second target memory bank. Write logic 124 may determine that the selected cache line corresponds to the location to which data is to be written to in the second target memory bank by determining that valid field 206 of the selected cache line contains a value that indicates that the selected cache line is valid and/or the bank address signals received via second write port 108 are equal to the value stored in tag field 208 of the selected cache line. Write logic 124 may determine that the selected cache line does not correspond to the location to which data is to be written to in the second target memory bank by determining that valid field 206 of the selected cache line contains a value that indicates that the selected cache line is invalid or the bank address signals received via second write port 108 are not equal to the value stored in tag field 208 of the selected cache line. If write logic 124 determines that the selected cache line corresponds to the location to which data is to be written to in the second targeted memory bank, flow continues to step 912. Otherwise, flow continues to step 914.

At step 912, data for the second incoming write operation is written to a second location (i.e., the selected cache line) in cache 112 (for example, in data field 210 of the selected cache line). Along with writing the write data to the second location, write logic 124 sets the value stored in valid field 206 to '1' to indicate that the cache line is valid and/or stores the value of the bank address signals received via second write port 108 into tag field 208. It is noted that because the first incoming write operation is blocked by the two incoming read operations, the write data associated with the first incoming write operation is stored in a first location of cache 112, as described above with reference to FIG. 8.

At step 914, because the selected cache line does not correspond to the location to be written to in the second target memory bank, the selected cache line may contain data from a previously-blocked write operation. If the write data associated with second incoming write operation were to overwrite this data, the data would be lost. As a result, before the write data is written to the selected cache line, the data from the previously-blocked write operation stored in the selected cache line is written to the target memory bank specified by the value in tag field 208 of the selected cache line to preserve the data. Once this data is written to the target memory bank, write logic 124 sets the value stored in valid field 206 to '1' to indicate that the cache line is valid, stores the value of the bank address signals received via second write port 108 into tag field 208, and/or stores the write data associated with the second incoming write operation into data field 210.

At step 916, write logic 124 receives a cache line that is selected by a cache lookup operation that is performed on cache 112. The cache line may be selected using index address signals received via second write port 108.

At step 918, write logic 124 determines whether the selected cache line corresponds to the location to be written to in the second target memory bank. Write logic 124 may determine that the selected cache line corresponds to the location to which data is to be written to in the second target memory bank by determining that valid field 206 of the selected cache line contains a value that indicates that the selected cache line is valid and/or the bank address signals received via second write port 108 are equal to the value stored in tag field 208 of the selected cache line. Write logic 124 may determine that the selected cache line does not correspond to the location to which data is to be written to in the second target memory bank by determining that valid field 206 of the selected cache line contains a value that indicates that the selected cache line is invalid or the bank address signals received via second write port 108 are not equal to the value stored in tag field 208 of the selected cache line. If write logic 124 determines that the selected cache line corresponds to the location to which data is to be written to in the second targeted memory bank, flow continues to step 912. Otherwise, flow continues to step 920.

At step 920, write logic 124 determines whether the first and second incoming write operations are directed to the same index and whether a selected cache line for the first incoming write operation corresponds to the location to be written to in the memory bank targeted by the first incoming write operation. Write logic 124 may determine whether the second incoming write operation is directed to the same index as the first incoming write operation by comparing the index address signals received via first write port 106 and the index address signals received via second write port 108. If the index address signals match, then the first and second incoming write operations are directed to the same index. If the index address signals do not match, then the first and second incoming write operations are not directed to the same index. Write logic 124 determines whether the selected cache line for the first incoming write operation corresponds to a location to be written to in the memory bank targeted by the first incoming write operation in a manner described above with respect to step 808 of FIG. 8. If write logic 124 determines that a second incoming write operation is directed to the same index as the first incoming write operation and the selected cache line for the first incoming write operation corresponds to a location to be written to in the memory bank targeted by the first incoming write operation, then flow continues to step 912. Otherwise, flow continues to step 914.

It is noted that in addition to the operations performed at step 912, the write data associated with the first incoming write operation is written to the memory bank targeted by the first incoming write operation even though the selected cache line for the first incoming write operation corresponds to the location to be written to in the memory bank targeted by the first incoming write operation. The write data associated with the first incoming write operation is not written to the selected cache line for the first incoming write operation because the first and second incoming write operations are directed to the same index. That is, the write data associated with a first incoming write operation and the write data associated with a second write operation are not written to the same location in the cache to prevent data inconsistency. Instead, the write data associated with the first incoming write operation is written to the memory bank targeted by the first incoming write operation (which is different than the memory banks targeted by the first and second incoming read operations and the second incoming write operation).

Turning now to FIG. 9B, at step 922, write logic 124 determines whether the first and second incoming write operations are directed to the same index. Write logic 124 may determine whether the second incoming write operation is directed to the same index as the first incoming write operation by comparing the index address signals received via first write port 106 and the index address signals received via second write port 108. If the index address signals match, then the first and second incoming write operations are directed to the same index. If the index address signals do not match, then the first and second incoming write operations are not directed to the same index. If write logic 124 determines that a second incoming write operation is directed to the same index as the first incoming write operation, then flow continues to step 932. Otherwise, flow continues to step 924.

At step 924, write logic 124 receives a cache line that is selected by a cache lookup operation that is performed on cache 112. The cache line may be selected using index address signals received via second write port 108.

At step 926, write logic 124 determines whether the selected cache line corresponds to the location to be written to in the second target memory bank. Write logic 124 may determine that the selected cache line corresponds to the location to which data is to be written to in the second target memory bank by determining that valid field 206 of the selected cache line contains a value that indicates that the selected cache line is valid and/or the bank address signals received via second write port 108 are equal to the value stored in tag field 208 of the selected cache line. Write logic 124 may determine that the selected cache line does not correspond to the location to which data is to be written to in the second target memory bank by determining that valid field 206 of the selected cache line contains a value that indicates that the selected cache line is invalid or the bank address signals received via second write port 108 are not equal to the value stored in tag field 208 of the selected cache line If write logic 124 determines that the selected cache line corresponds to the location to which data is to be written to in the second targeted memory bank, flow continues to step 928. Otherwise, flow continues to step 930.

At step 928, the data associated with the second incoming write operation is written to the second target memory bank.

At step 930, data for the second incoming write operation is written to a second location (i.e., the selected cache line) in cache 112 (for example, in data field 210 of the selected cache line). Along with writing the write data to the second location, write logic 124 sets the value stored in valid field 206 to '1' to indicate that the cache line is valid and/or stores the value of the bank address signals received via second write port 108 into tag field 208.

At step 932, write logic 124 receives a cache line that is selected by a cache lookup operation that is performed on cache 112. The cache line may be selected using index address signals received via second write port 108.

At step 934, write logic 124 determines whether the selected cache line corresponds to the location to be written to in the second target memory bank. Write logic 124 may determine that the selected cache line corresponds to the location to which data is to be written to in the second target memory bank by determining that valid field 206 of the selected cache line contains a value that indicates that the selected cache line is valid and/or the bank address signals received via second write port 108 are equal to the value stored in tag field 208 of the selected cache line. Write logic 124 may determine that the selected cache line does not correspond to the location to which data is to be written to in the second target memory bank by determining that valid field 206 of the selected cache line contains a value that indicates that the selected cache line is invalid or the bank address signals received via second write port 108 are not equal to the value stored in tag field 208 of the selected cache line If write logic 124 determines that the selected cache line corresponds to the location to which data is to be written to in the second targeted memory bank, flow continues to step 930. Otherwise, flow continues to step 936.

At step 936, write logic 124 determines whether a selected cache line for the first incoming write operation corresponds to the location to be written to in the memory bank targeted by the first incoming write operation. Write logic 124 determines whether the selected cache line for the first incoming write operation corresponds to a location to be written to in the memory bank targeted by the first incoming write operation in a manner described above with respect to step 808 of FIG. 8. If write logic 124 determines that the selected cache line for the first incoming write operation corresponds to a location to be written to in the memory bank targeted by the first incoming write operation, then flow continues to step 928. Otherwise, flow continues to step 938.

At step 938, because the selected cache line does not correspond to the location to be written to in the second target memory bank, the selected cache line may contain data from a previously-blocked write operation. If the write data associated with second incoming write operation were to overwrite this data, the data would be lost. As a result, before the write data is written to the selected cache line, the data from the previously-blocked write operation stored in the selected cache line is written to the target memory bank specified by the value in tag field 208 of the selected cache line to preserve the data. Once this data is written to the target memory bank, write logic 124 sets the value stored in valid field 206 to '1' to indicate that the cache line is valid, stores the value of the bank address signals received via second write port 108 into tag field 208, and/or stores the write data associated with the second incoming write operation into data field 210.

It is noted that step 938 may be performed when certain conditions are met (along with the conditions specified at step 936). For example, step 938 may be performed when the target memory banks for the first and second incoming write operations are the same as a memory bank targeted by one incoming read operation. In this situation, one write port is available for writing data. Thus, write data for one incoming write operation may be written to the target memory bank, and write data for the other incoming write operation may be written to a location in cache 112. In the event that the target memory banks for the first and second incoming write operations are not the same to any of the memory banks targeted by first and/or second incoming read operations, then both the write data for the first incoming write operation and the write data for the second incoming write operation may be written to their respective target memory banks.

III. Other Example Embodiments

Embodiments described herein may generally be used with any type of memory. In one embodiment, the memory may be a circuit included on a device with other types of circuits. For example, the memory may be integrated into a processor device, memory controller device, or other type of integrated circuit device. Devices into which the memory is integrated may include system-on-a-chip (SOC) devices. In another embodiment, the memory may be provided as a memory device which is used with a separate memory controller device or processor device.

Whether the memory is integrated into a device with other circuits or provided as a separate device, the memory may be used as part of a larger computer system. The computer system may include a motherboard, central processor, memory controller, the memory, a hard drive, graphics processor, peripherals, and any other devices which may be found in a computer system. The computer system may be part of a personal computer, a server computer, or a smaller system such as an embedded system, personal digital assistant (PDA), or mobile phone.

In some cases, a device including the memory may be packaged together with other devices. Such packages may include any other types of devices, including devices with the same type of memory, devices with different types of memory, and/or devices including processors and/or memory controllers. Also, in some cases, the memory may be included in a device mounted on a memory module. The memory module may include other devices including memories, a buffer chip device, and/or a controller chip device. The memory module may also be included in a larger system such as the systems described above.

In some cases, embodiments may be used with multiple types of memory or with a memory which is included on a device with multiple other types of memory. The memory types may include volatile memory and non-volatile memory. Volatile memories may include static random access memory (SRAM), pseudo-static random access memory (PSRAM), and dynamic random access memory (DRAM). DRAM types may include single data rate (SDR) DRAM, double data rate (DDR) DRAM, low power (LP) DDR DRAM, and any other types of DRAM. Nonvolatile memory types may include magnetic RAM (MRAM), flash memory, resistive RAM (RRAM), ferroelectric RAM (FeRAM), phase-change RAM (PRAM), electrically erasable programmable read-only memory (EEPROM), laser programmable fuses, electrically programmable fuses (e-fuses), and any other types of non-volatile memory.

IV. Conclusion

While various embodiments have been described above, it should be understood that they have been presented by way of example only, and not limitation. It will be apparent to persons skilled in the relevant art(s) that various changes in form and details can be made therein without departing from the spirit and scope of the the subject matter described herein. Thus, the breadth and scope of the subject matter described herein should not be limited by any of the above-described exemplary embodiments, but should be defined only in accordance with the following claims and their equivalents.

What is claimed is:

1. A memory device, comprising:
one or more memory banks;
at least one cache coupled to each of the one or more memory banks; and
control logic coupled to each of the one or more memory banks and to the at least one cache, wherein the control logic is configured to:
determine whether a first incoming write operation configured to write data to a first target memory bank among the one or more memory banks and a second incoming write operation configured to write data to a second target memory bank among the one or more memory banks received during a same clock cycle are blocked by at least one incoming read operation configured to read data from a third target memory bank among the one or more memory banks;
write the data associated with the first incoming write operation to a first location in the at least one cache and write the data associated with the second incoming write operation to a second location in the at least one cache in response to determining that the first incoming write operation and the second incoming write operation are blocked by the at least one incoming read operation; and
write the data associated with the first incoming write operation to a first location in the at least one cache and write the data associated with the second incoming write operation to the second target memory bank in response to determining that the first incoming write operation is blocked by the at least one incoming read operation and the second incoming write operation is not blocked by the at least one incoming read operation.

2. The memory device of claim 1, wherein the control logic is configured to determine whether the first incoming write operation and the second incoming write operation are blocked by at least two incoming read operations.

3. The memory device of claim 1, wherein the first incoming write operation is blocked by the at least one incoming read operation when at least the first target memory bank and the third target memory bank are the same.

4. The memory device of claim 1, wherein the control logic is further configured to write the data associated with the first incoming write operation from the first location in the at least one cache to the first target memory bank in response to determining that data associated with a third incoming write operation is to be written to the first location.

5. The memory device of claim 1, wherein the control logic is further configured to:
    determine whether data associated with a first incoming read operation is stored in the at least one cache;
    read the data associated with the first incoming read operation from the at least one cache in response to determining that the data associated with the first incoming read operation is stored in the at least one cache; and
    read the data associated with the first incoming read operation from a target memory bank among the plurality of memory banks specified by the first incoming read operation in response to determining that the data associated with the first incoming read operation is not stored in the at least one cache.

6. The memory device of claim 1, wherein the control logic is further configured to:
    determine whether the at least one cache contains a cache line corresponding to a location to be written to in the first target memory bank in response to determining that the first incoming write operation is not blocked by the at least one incoming read operation;
    in response to determining that the at least one cache contains a cache line corresponding to the location to be written to in the first target memory bank, write the data associated with first incoming write operation to the cache line; and
    in response to determining that the at least one cache does not contain a cache line corresponding to the location to be written to in the first target memory bank, write the data associated with the first incoming write operation to the first target memory bank.

7. The memory device of claim 1, wherein the at least one cache comprises at least two register files, wherein a first one of the at least two register files is a mirrored version of a second one of the at least two register files.

8. A method, comprising:
    determining whether a first incoming write operation configured to write data to a first target memory bank among one or more memory banks is blocked by at least one incoming read operation configured to read data from a second target memory bank among the one or more memory banks;
    determining whether at least one cache coupled to the one or more memory banks contains a cache line corresponding to a location to be written to in the first target memory bank in response to determining that the first incoming write operation is not blocked by the at least one incoming read operation;
    in response to determining that the at least one cache contains a cache line corresponding to the location to be written to in the first target memory bank, writing the data associated with first incoming write operation to the cache line; and
    in response to determining that the at least one cache does not contain a cache line corresponding to the location to be written to in the first target memory bank, writing the data associated with the first incoming write operation to the first target memory bank.

9. The method of claim 8, wherein the determining comprises:
    determining whether the first incoming write operation is blocked by at least two incoming read operations.

10. The method of claim 8, further comprising:
    determining whether a second incoming write operation received during a same clock cycle as the first incoming write operation and configured to write data to a third target memory bank among the plurality of memory banks is also blocked by the at least one incoming read operation;
    writing the data associated with the first incoming write operation to a first location in the at least one cache and writing data associated with the second incoming write operation to a second location in the at least one cache in response to determining that the first incoming write is blocked by the at least one incoming read operation and the second incoming write is also blocked by the at least one incoming read operation; and
    writing the data associated with the first incoming write operation to the first location in the at least one cache and writing the data associated with the second incoming write operation to the third target memory bank in response to determining that the first incoming write is blocked by the at least one incoming read operation and the second incoming write operation is not blocked by the at least one incoming read operation.

11. The method of claim 8, wherein the determining comprises:
    determining that the first incoming write operation is blocked by the at least one incoming read operation when at least the first target memory bank and the second target memory bank are the same.

12. The method of claim 8, further comprising:
    writing the data associated with the first incoming write operation from the first location in the at least one cache to the first target memory bank in response to determining that data associated with a second incoming write operation is to be written to the first location.

13. The method of claim 8, further comprising:
    determining whether data associated with a first incoming read operation is stored in the at least one cache;
    reading the data associated with the first incoming read operation from the at least one cache in response to determining that the data associated with the first incoming read operation is stored in the at least one cache; and
    reading the data associated with the first incoming read operation from a target memory bank among the plurality of memory banks specified by the first incoming read operation in response to determining that the data associated with the first incoming read operation is not stored in the at least one cache.

14. The method of claim 8, further comprising:
    writing the data associated with the first incoming write operation to a first location in the at least one cache in response to determining that the first incoming write operation is blocked by the at least one incoming read operation.

15. An apparatus, comprising:
    one or more memory banks; and
    control logic configured to be coupled to each of the one or more memory banks and at least one cache, wherein the control logic is configured to:

determine whether a first incoming write operation configured to write data to a first target memory bank among the one or more memory banks and a second incoming write operation configured to write data to a second target memory bank among the one or more memory banks received during a same clock cycle are blocked by at least one incoming read operation configured to read data from a third target memory bank among the one or more memory banks;

write the data associated with the first incoming write operation to a first location in the at least one cache and write the data associated with the second incoming write operation to a second location in the at least one cache in response to determining that the first incoming write operation and the second incoming write operation are blocked by the at least one incoming read operation write the data associated with the first incoming write operation to a first location in the at least one cache and write the data associated with the second incoming write operation to the second target memory bank in response to determining that the first incoming write operation is blocked by the at least one incoming read operation and the second incoming write operation is not blocked by the at least one incoming read operation.

16. The apparatus of claim 15, wherein the control logic is configured to determine whether the first incoming write operation and the second incoming write operation are blocked by at least two incoming read operations.

17. The apparatus of claim 15, wherein the first incoming write operation is blocked by the at least one incoming read operation when at least the first target memory bank and the third target memory bank are the same.

18. The apparatus of claim 15, wherein the control logic is further configured to write the data associated with the first incoming write operation from the first location in the at least one cache to the first target memory bank in response to determining that data associated with a third incoming write operation is to be written to the first location.

19. The apparatus of claim 15, wherein the control logic is further configured to:

determine whether data associated with a first incoming read operation is stored in the at least one cache;

read the data associated with the first incoming read operation from the at least one cache in response to determining that the data associated with the first incoming read operation is stored in the at least one cache; and read the data associated with the first incoming read operation from a target memory bank among the plurality of memory banks specified by the first incoming read operation in response to determining that the data associated with the first incoming read operation is not stored in the at least one cache.

20. The apparatus of claim 15, wherein the control logic is further configured to:

determine whether the at least one cache contains a cache line corresponding to a location to be written to in the first target memory bank in response to determining that the first incoming write operation is not blocked by the at least one incoming read operation.

* * * * *